XR 2,969,512

42
X 89531
X 89579

(2)

Jan. 24, 1961 H. JAFFE ET AL 2,969,512

PIEZOELECTRIC CERAMIC RESONATORS

Filed Feb. 17, 1960

INVENTORS
HANS JAFFE
DON A. BERLINCOURT
BY
Francis T. Marsella
ATTORNEY

2969512
OR IN 333/72

United States Patent Office 2,969,512

Patented Jan. 24, 1961

2,969,512

PIEZOELECTRIC CERAMIC RESONATORS

Hans Jaffe, Cleveland Heights, and Don A. Berlincourt, Chagrin Falls, Ohio, assignors to Clevite Corporation, Cleveland, Ohio, a corporation of Ohio Filed Feb. 17, 1960, Ser. No. 9,352

11 Claims. (Cl. 333—72)

This invention relates to electromechanical transducers and particularly to piezoelectric ceramic resonators specifically adapted for use as electric wave filters and frequency selective transformers.

This application is a continuation-in-part of application Serial No. 610,103, now abandoned, filed September 17, 1956, by Hans Jaffe and Don A. Berlincourt and assigned to the assignee of the present invention.

The invention will be described with particular reference to its application in I.-F. band-pass filters; while this appears at the present time to be the principal area of utility of the resonators herein disclosed, no limitation on the range of operating frequencies, other operating conditions, applications or characteristics is intended.

The term "piezoelectric ceramics" is used herein to designate polycrystalline ferroelectric ceramic materials, fired to maturity, which are capable of being electrostatically polarized to impart thereto piezoelectric properties generally similar to those possessed by certain naturally piezoelectric crystalline materials such as quartz and Rochelle salt.

Perhaps the most prominent of the piezoelectric ceramics at the present time is barium titanate ($BaTiO_3$), the production and polarization of which is fully disclosed in U.S. Letters Patent No. 2,486,560 to R. Gray. Other examples are the lead titanate-zirconate ceramics, $Pb(Zr, Ti)O_3$. These ceramics are solid solutions of lead titanate and lead zirconate which, in certain mol ratios, are ferroelectric and possess high piezoelectric coupling in the polarized state as disclosed in U.S. Letters Patent No. 2,708,244 to B. Jaffe. The above-mentioned and many other ferroelectric ceramics are well known to persons skilled in the art.

In the past piezoelectric resonators have been used in electric wave filters, such resonators most frequently consisting of plates cut from quartz crystals at a preselected orientation relative to the crystallographic axes. A well-known example of such a resonator plate is the "GT cut." Pure quartz filters (i.e., employing only crystals and capacitors), owing to the relatively low (about 10%) electromechanical coupling coefficient of quartz, are inherently limited to a very narrow relative band width, viz., less than 1%. Moreover, the relatively low dielectric constant of quartz, results in elements of high impedance characteristics. The high quality factor of quartz (over 50,000), however, admirably adapts quartz plates to use in the frequency control of oscillators and the like. Examples of conventional quartz resonators are those described in U.S. Patent No. 2,262,966 to L. Rhode. These resonators operate in either the longitudinal mode or the transverse mode.

The effort to overcome the disadvantages of single crystal resonators, e.g., very high impedance and narrow pass-bands, and to provide piezoelectric transformers capable of substantial transformation ratios, led to the development of resonator elements of piezoelectric ceramic materials as disclosed and claimed in U.S. Letters Patent No. 2,830,274 to Rosen et al. Such resonator elements, while they represent a considerable advance over single crystal devices, are subject to certain practical difficulties: It is well-known in the art that polarization of a ferroelectric ceramic body is, in theory, a very simple procedure but, in practice, becomes quite difficult when operating on massive pieces and/or where the direction of polarization coincides with a long dimension of the piece, particularly if the lateral dimensions of the piece are relatively small.

While quartz and poled ferroelectric ceramics have their piezoelectric effect in common, the two are not equivalent for the purposes of the present invention which is inherently limited to ceramic resonators as will become apparent in the course of the following description.

According to the present invention a piezoelectric resonator element comprises a thin flat plate of polarizable ferroelectric ceramic material having substantially identical and parallel major planar surfaces having at least three-fold symmetry about an axis perpendicular thereto. The thickness dimension of the plate is sufficiently small relative to the planar dimensions thereof that, with the plate polarized perpendicular to its major planar surfaces, its piezoelectric response to electric potential gradients between its major surfaces at frequencies near the fundamental resonance and its overtones is predominantly in the lateral modes and negligible in the thickness modes. The plane configuration of the plate is such that all lateral modes coalesce to produce a single contour extensional mode, the planar dimensions of the plate being adapted to impart thereto a resonance of vibrations in the contour extensional mode at a particular selected frequency. Operating electrode means are conductively associated with both major planar surfaces of the plate, including a first electrode on one of its major surfaces, a second electrode on the same major surface, disposed about and laterally spaced from the first electrode, and at least one additional electrode on the other major planar surface of the plate, shaped, located and dimensioned to serve as a counter-electrode. The plate is polarized only in a direction perpendicular to its major surfaces, the lateral extent of polarization including at least the entire thickness regions of the plate underlying the first and second electrodes.

The general object of the invention is to provide novel piezoelectric ceramic resonators overcoming at least one of the problems of the prior art as outlined above.

Another object of the invention is to provide novel ferroelectric ceramic resonators applicable for use as electric wave filters and frequency-selective transformers.

Another object is the provision of improved piezoelectric resonators for electric wave filter circuits which are characterized by low insertion losses and relatively high selectivity.

A further object is the provision of novel piezoelectric resonator elements characterized by lower impedance than comparable crystal resonators.

Another object is the provision of novel piezoelectric ceramic resonator elements requiring polarization in one direction only.

Still another object is the provision of novel ceramic resonators in accordance with the immediately preceding object the polarization of which is further simplified by virtue of the fact that the axis of polarization coincides with the smallest dimension of the resonator body.

A further object is the provision of improved piezoelectric resonators for use as wave filters and frequency-selective transformers which are simpler in construction, more compact, and less expensive than comparable electromagnetic or electromechanical components.

Figures 1, 2, 5:
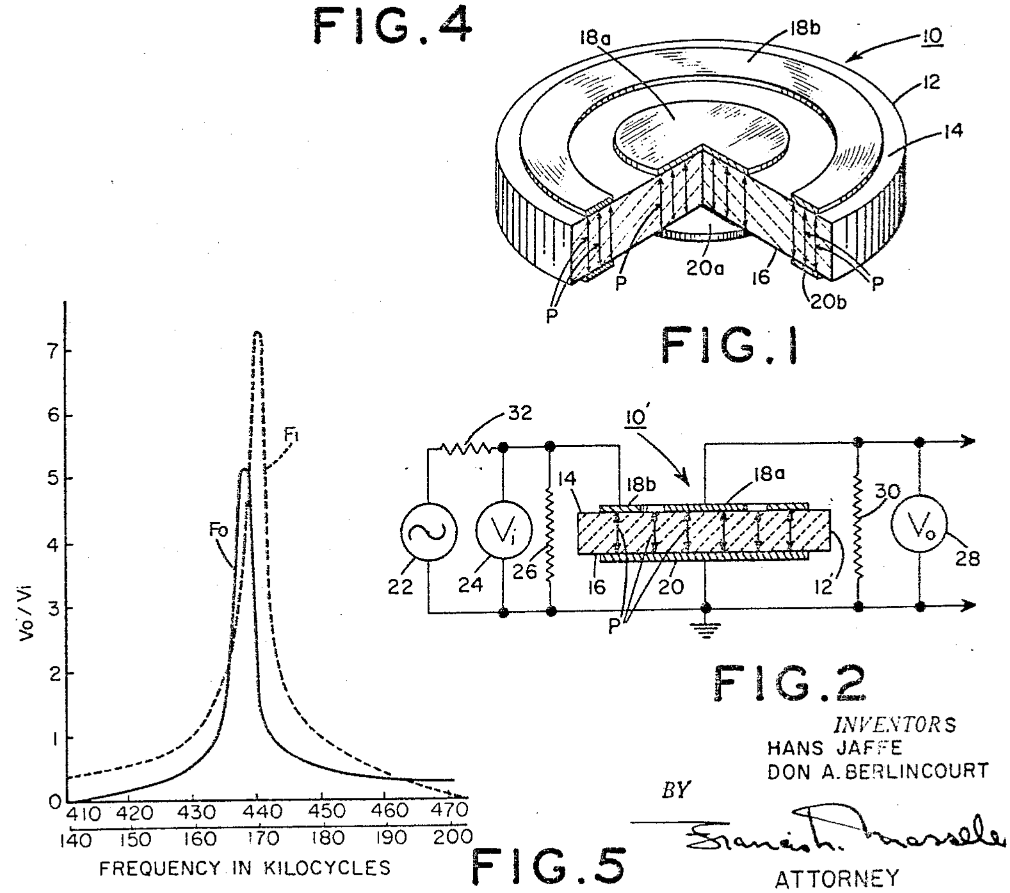
Figure 1 is a perspective view, partly in section, of a piezoelectric resonator according to the present invention.
Figure 2 is a schematic diagram of a test circuit embodying resonators of the general type shown in Figure 1.
Figure 5 is a graphic representation of the band-pass characteristics of a filter-transformer according to the present invention.

With continued reference to the drawings and first particularly to Figure 1, a piezoelectric resonator 10 according to the present invention comprises a thin flat plate 12, of a polarizable ferroelectric polycrystalline ceramic material. From the standpoint of ease of fabrication, as well as excellence of performance, it is preferred that plate 12 take the form of a disk as shown in Figure 1 and, accordingly, it will be so described for purposes of example. Other plane configurations are operative, however, including any polygon having at least three-fold symmetry about an axis perpendicular to its plane. This would include, for example, the equilateral triangle, square, pentagon, etc., but exclude the rectangle, rhombus, trapezoid, and the like.

Figure 3:
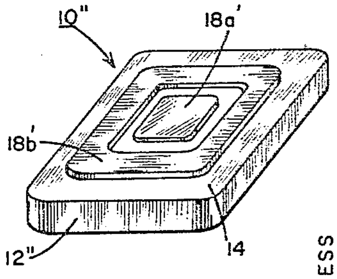
Figure 3 is a perspective elevation of a modified form of the resonator shown in Figure 1.

The over-riding requirement in any case is that the configuration be one in which all fundamental lateral (i.e., planar) modes of vibration coalesce to form a single contour extensional mode. While this requirement would be fulfilled from the theoretical standpoint by a large number of regular polygonal shapes and modifications thereof, practical and economic considerations in the application of the invention would favor the disk or a square with rounded corners such as illustrated in Figure 3 and hereinafter described in greater detail.

Referring once again to Figure 1, discoid plate 12 has conductively associated therewith operating electrode means through which electric signal potentials are applied to and derived from the major surfaces 14 and 16 of the plate. These electrode means include an electrode **18*a* substantially centered on one major surface of disk 12 and a second electrode 18*b* on the same surface, concentrically disposed about electrode 18*a*. On the other major surface of disk 12 is an electrode 20*a* and a second electrode 20*b*, which conform in shape, area, and placement, and thus are directly opposite, to electrodes 18*a* and 18*b***, respectively.

If desired, the electrodes on one disk surface may be replaced by a single electrode adapted by virtue of its area, shape and location to serve as a counter-electrode to those on the opposite surface of the plate. A resonator 10′ shown in Figure 2, illustrates the modification employing a single electrode 20, on one surface of resonator plate 12′. A single electrode such as 20 may conveniently cover the entire surface with which it is associated; in any case its area would not ordinarily be materially less than that circumscribed by the outer perimeter of the outermost electrode (**18*b*) on the opposite plate surface. The electrode configuration of resonator 10′, Figure 2, tends to introduce some distributed electrical capacitance but otherwise the operating characteristics are substantially the same as for resonator 10**, Figure 1.

When, as in the case of resonator 10, plate 12 takes the form of a disk, electrode **18*a* is substantially circular and 18*b* annular in configuration. Where other plate shapes are used, the electrodes may also be circular or annular, as the case may be, or they may conform generally to the shape of the plate as shown in resonator 10″, Figure 3. In any case, the outer electrode (e.g., 18*b***) is substantially of uniform width and uniformly spaced from the inner electrode.

The electrodes may be formed of any suitable conductive material, fired onto the plate or applied in the form of an air-drying paint. Air-drying silver has been found satisfactory for the purpose. Use of the silk-screen technique facilitates formation of the desired electrode shapes.

The area and location of the electrodes are parameters of considerable importance; inasmuch as they are closely related to the functioning of the resonators this aspect of the invention is elucidated hereinbelow in connection with an analysis and description of their operation.

Disk 12 is polarized in an axial (thickness) direction in the regions between electrodes **18*a*, 18*b* and respective counter-electrodes 20*a*, 20*b* as indicated by double-headed arrows P. This may be accomplished in any suitable manner as by connecting the electrodes on one side of disk 12** to one pole of a D.-C. voltage source (not shown) and those on the other side to the opposite pole. The field strength, duration and other conditions are selected to suit the particular ceramic in accordance with standard procedures.

If desired, disk 12 can be polarized throughout its planar cross-section by fully electroding, and applying the poling field between, both major surfaces. Thereafter, the poling electrodes may be removed entirely and new electrodes applied or the poling electrodes may be removed in selected areas to obtain the desired configuration for the operating electrodes.

In any case the disk is polarized only along an axis perpendicular to its major surfaces and the lateral extent of the polarization includes at least those regions of the disk disposed intermediate respective opposing electrodes on the major surfaces.

Disk 12, as well as all other plates illustrated in the drawings, is greatly enlarged over its actual size in most practical applications, the size depending on the desired frequency of operation, i.e., the disk would be proportioned for resonance in its contour extensional mode at a preselected frequency.

The thickness dimension of plate 12 is sufficiently small as compared to its planar dimensions (i.e., the diameter in the case of a disk) that piezoelectric response of the plate to electric potential gradients between its major planar surfaces at frequencies near the fundamental resonance and its overtones is predominantly in the lateral, or planar, mode with negligible response in the thickness and all other modes.

In practical resonator disks for use as I.-F. bandpass filter-transformers, a diameter/thickness ratio of 5:1 to 10:1 is preferred although a ratio as low as 4:1 may be satisfactory for some applications. With sufficiently thin plates the resonant frequency of the plate is determined primarily by its planar dimensions which therefore are selected to impart a resonance (fundamental or overtone) of vibrations in the contour mode at a particular selected frequency, e.g., the center frequency of the desired pass-band. Thus, for example, if disk 12 were designed for use as a filter for I.-F. frequencies (about 455 to 465 kc.) and to be operated at its fundamental resonance, its diameter would be in the order of $\frac{3}{16}$ inch. Unless compactness is the sole consideration, it may be more convenient to proportion the disk for operation at its first or second overtone and thus enable the use of a larger disk. For example, a thin disk having a fundamental resonance at about 180 kc. has a first overtone in the I.-F. range (about 455 kc.) and has a diameter of approximately ½ inch. A disk operating at a low order (1st or 2nd) overtone has advantages, in addition to its convenient size in the I.-F. range, which will become apparent as the description proceeds.

The resonator disk can be fabricated by any standard ceramic technique such as by pressing, extruding, or slip casting to a rough oversize dimension followed, after firing, by grinding and polishing to the finished dimension. Alternatively, the rough disk can be cut from a piece of cylindrical stock of matured ceramics.

As briefly mentioned hereinabove, the material forming disk 12, as well as any other of the other discoid bodies illustrated and hereinafter described, may be any one of several ferroelectric polycrystalline ceramic compositions which, in themselves, are well-known in the art. Examples of suitable materials are barium titanate, lead zirconate titanate, or modifications thereof. It is probable that additional suitable ceramics will be discovered from time to time in the future. As previously mentioned, piezoelectric ceramics as contemplated and embraced in this description are ferroelectric polycrystalline ceramic materials fired to maturity, which can be conditioned (i.e., polarized) by the application of an electrostatic field to impart piezoelectric properties which are retained to a large degree after the field has been removed. Such ceramic materials are usually characterized by a perovskite crystal structure and, as a class, exhibit a significantly higher piezoelectric response than most naturally piezoelectric crystals; when properly poled, retained electromechanical couplings in a contour extensional mode in the order of 50% or more are not uncommon in some ferroelectric ceramics, particularly the lead titanate-zirconates. In further contrast to most piezoelectric crystals, all ferroelectric polycrystalline ceramics are isotropic in a plane perpendicular to the axis or direction of polarization. Disks of such ceramics, therefore, have both an axial (or thickness) and a true contour extensional mode of vibration. The contour extensional mode, which is essential to resonator elements according to the invention, does not exist as an isolated mode in quartz or even single crystals of ferroelectric materials available at present.

Another characteristic of piezoelectric ceramics is the slow decay or "aging" of electromechanical coupling and variation of other properties, such as dielectric constant and frequency constant, with time and/or temperature. Inasmuch as susceptibility to aging and temperature dependence of properties is more pronounced in some ceramics than others, the more stable materials are preferred for use in the present invention. Particularly suited are ferroelectric ceramics of the type disclosed and claimed in U.S. Letters Patent No. 2,911,370 and pending application of F. Kulcsar, Serial No. 805,985 filed April 13, 1959.

Resonators according to the present invention may be used, singly or in groups, alone or in combination with conventional electrical components in standard circuits, in accordance with general knowledge in the art. Inasmuch as the particular circuitry employed is not germane to the invention, the circuit connections and operation will be described in conjunction with a test circuit, shown in Figure 2, utilized to evaluate the performance characteristics of the resonators.

In Figure 2, 22 represents a conventional signal generator which provides an input signal, of selectively variable frequencies, to resonator 10'. Resonator 10' is in all respects identical to that illustrated in Figure 1 except that, as already mentioned, a single electrode 20 is employed on one major surface in place of separate counter-electrodes 20*a* and 20*b*. In addition, disk 12' is shown as having its polarization extending across its entire planar cross-section, as indicated by double-headed arrows "P."

In an actual installation, the input signal would originate in a preceding stage of the circuit in which the resonator, or a network of resonators, is installed, for example, in the mixer, or a preceding I.-F. amplification stage, of a superheterodyne radio receiver.

As will be readily apparent from Figure 2, a voltmeter 24 is connected to read the amplitude of an input signal voltage $V_i$ across a resistor 26 and voltmeter 28 to read the output signal $V_o$ across a load resistor 30. One terminal of signal generator 22 and single counter-electrode 20 on surface 16 of disk 12' are connected directly to a common ground potential. The other terminal of signal generator 22 is connected to the outer electrode (18*b*) on the other surface (14) of disk 12' through a resistor 32 and to ground through resistors 32 and 26 in series. Electrode 18*a* is connected to the ground potential through load resistor 30.

From the circuit described and illustrated it will be appreciated, therefore, that the input signal is applied to electrode 18*b* and the output signal taken off at electrode 18*a*. By varying the frequency of the signal generated by signal generator 22 through a range including the design pass-band frequency of resonator 10', the response characteristics of the resonator is determined from the ratio of $V_o/V_i$. A plot of $V_o/V_i$ against frequency of the input signal for typical resonators according to the invention is shown in Figure 5 and will be discussed hereinbelow. The data presented in Figure 5 was obtained using the circuit of Figure 2 with the following values of resistance:

| | Ohms |
|---|---|
| Resistor 26 | 1000 |
| Resistor 30 | 5000 |
| Resistor 32 | 1000 |

In general respects, the operation of resonator 10' is as follows: assuming the disk 12' is proportioned for fundamental or overtone resonance in the contour extensional mode at or near the center frequency of the desired pass-band, A.-C. signals outside the pass-band excite little or no response in disk 12' and are, therefore, substantially attenuated. Applied frequencies in the pass-band, however, cause disk 12' to vibrate vigorously in its contour mode at a natural resonant frequency (fundamental or an overtone). In I.-F. applications, the wide separation between the sum and difference frequencies would prevent the resonator from responding to harmonics other than that desired.

The contour mode vibration of disk 12' piezoelectrically generates an A.-C. voltage (with respect to ground), at or near the center frequency of the pass-band, which appears at electrode 18*a*. By proper placement and proportioning of the electrodes as hereinafter set forth, a favorable impedance and voltage transformation of the passed frequencies can be achieved.

Referring now to Figure 3, there is illustrated a piezoelectric ceramic resonator 10" which is in all respects identical to the discoid forms 10 and 10', already described, except for the plane configuration of its resonator plate 12" and operating electrodes 18*a*' and 18*b*'. Plate 12" is a square with rounded corners, a configuration regarded as second only to a disk from the standpoint of combining clean contour mode response with ease of fabrication. Electrodes 18*a*' and 18*b*' may be opposed by duplicate counter-electrodes on the underside of the plate or a single counter-electrode provided.

While all specifically disclosed forms of resonators have a maximum of two electrodes any one surface of the plate, it will be appreciated that additional screen electrodes may be employed, if desired, as disclosed in the aforementioned U.S. Letters Patent No. 2,262,966. Moreover, additional annular electrodes may be employed, as required, to achieve optimum utilization of stress distribution occurring at the second and higher order overtones.

The factors governing the number, location and areas of the electrodes will become apparent from the following analysis of the operation of resonators according to the invention.

The terms and conventions applied in the ensuing analytical consideration are defined as follows (assuming consistent units throughout):

$T_\theta$—tangential or circumferential stress
$T_R$—radial stress
$T_Z$—axial stress
$E_R$—radial field
$E_Z$—axial field $g_{31}$—piezoelectric voltage output coefficient with stress perpendicular to direction of polarization $g_{33}$—piezoelectric voltage output coefficient with stress parallel to direction of polarization For barium titanate and lead titanate zirconate ceramics $$g_{31} \cong \frac{1}{2.4} g_{33}$$

$r$—radius of disk $r_a$—radius of the region of disk covered by electrode 18*a*

$r_b$, $r_c$—radii of inner and outer circumferences, respectively, of region of disk covered by electrode 18*b*.

Figure 4:
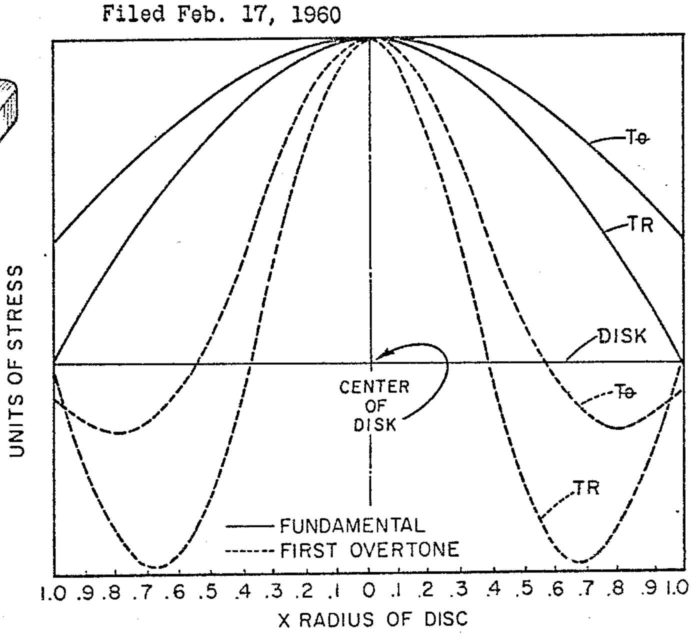
Figure 4 is a graphic representation of the distribution of radial and tangential stresses in a thin disk vibrating in its contour extensional mode at its fundamental and its first overtone frequency.

Referring to Figure 4, the radial and tangential stress functions of a thin ceramic disk vibrating in the contour extensional mode at its fundamental resonance and first overtone are represented approximately by curves $T_R$ and $T_\theta$, respectively. The axial stress $T_Z$, which is produced by the Poisson effect, is very small for thin disks and, therefore, is not shown. As indicated by the solid line curves, at fundamental resonance of the contour mode the radial stress $T_R$ is zero at the circumference of the disk and a maximum at its center where $T_R = T_\theta$. The tangential stress $T_\theta$ has a minimum value greater than zero at the circumference of the disk. The stresses $T_\theta$ and $T_R$ (taken as positive in sign) are in phase and opposite in phase to $T_Z$ which is, therefore considered negative.

Assuming that the disk is operating at its fundamental resonance, and noting the axial polarization and the stress functions represented by the solid line curves in Figure 4, the axial field is given by the equation $$E_Z = g_{31}(T_\theta + T_R) + g_{33}T_Z \quad (1)$$

Since $g_{33}$ and $T_Z$ are 180° out of phase with $g_{31}$ and $T_\theta$, $T_R$, respectively, no cancellation effects occur.

From Equation 1 it will be appreciated that the areas and location of respective electrodes can be selected to adjust the voltage and impedance transformation between the input and output terminals of the resonator. The minimum area of the input electrode is limited to the value necessary to adequately drive the resonator.

When the resonator is operated at an overtone resonance, the placement and relative areas of the electrodes is based on the stress functions for the particular overtone employed. Thus, for example, Figure 4 presents in broken line curves a stress diagram for a disk vibrating in the radial mode at its first overtone frequency (about 2.5 times the fundamental resonant frequency). From the diagram it will be seen that the following stress conditions exist:

(1) At the center of disk having radius $r$:

(*a*) $T_\theta = T_R$
(*b*) $T_\theta$, $T_R$ are positive maxima
(*c*) $T_Z$ is negative (2) For the central area ($\pi r_a^2$) of disk where $r_a \cong .4r$:

(*a*) $\Sigma T_\theta$ and $\Sigma T_R$ are positive
(*b*) $\Sigma T_\theta > \Sigma T_R$
(*c*) $T_Z$ is negative (3) At circumference ($2\pi r_a$) of central part of disk:

(*a*) $T_\theta$ is positive
(*b*) $T_R$ is zero
(*c*) $T_Z$ is negative (4) For the outer area $\pi(r^2 - r_a^2)$ of disk:

(*a*) $\Sigma T_\theta$ is negative
(*b*) $\Sigma T_R$ is negative
(*c*) $\Sigma T_R$ is more negative than $\Sigma T_\theta$.

Thus, if the disk in Figure 1 has a center electrode 18*a* with a radius $r_a$ not materially greater than about .4 the disk radius $r$, and the annular electrode 18b covers the remaining area of the disk except for a narrow gap (i.e., the radius $r_b$ is not materially less than .4 the disk radius), with disk vibrating at its first overtone resonance in the contour mode, the axial field is given by Equation 1, above, viz.:

$$E_Z = g_{31}(T_\theta + T_R) + g_{33}T_Z$$

Since all terms for the center portion of the disk are positive, no cancellation effects occur and a very favorable impedance transformation may be obtained.

In summary, then, the resonators disclosed provide an impedance and voltage transformation which depends on both area and location of the electrodes. The transformation includes the effect of the area, and therefore, capacitance ratio of the input and output electrodes, as well as the location of electrodes to eliminate or minimize the cancellation effects of opposing stresses.

The response charactertistics of a typical resonator according to the present invention is shown in Figure 5. The particular data presented in Figure 5 was obtained with a resonator of the type shown in Figure 1 operated at fundamental resonance, $F_0$, (solid line curve) and the first overtone, $F_1$, (broken line curve) in the circuit illustrated in Figure 2. The radius of the center electrode 18*a* was 0.4 times the radius of disk 12 and electrode 18*b* covered the remainder of the disk face except for a narrow gap between it and electrode 18*a*. From these curves it will be apparent that resonators according to the invention, used as filter transformers, are characterized by symmetrical and sharply defined pass-bands, high gain, and high signal to noise ratio. Several resonators may be combined in filter networks in accordance with well-established network theory to obtain the desired response characteristics to suit a particular circuit requirement.

While there have been described what at present are considered to be the preferred embodiments of the invention, it will be obvious to those skilled in the art that various changes and modifications can be made therein without departing from the invention, and it is aimed, therefore, in the appended claims to cover all such changes and modifications as fall within the true spirit and scope of the invention.

What is claimed and desired to be secured by United States Letters Patent is:

1. A piezoelectric resonator element comprising: a thin flat plate of polarizable ferroelectric ceramic material, said plate having substantially identical and parallel major planar surfaces having at least three-fold symmetry about an axis perpendicular thereto, the thickness dimension of said plate being sufficiently small relative to the planar dimensions thereof that, with the plate polarized perpendicular to said major surfaces, piezoelectric response of the plate to electric potential gradients between said major surfaces is predominently in the lateral modes and negligible in the thickness modes at frequencies near the fundamental resonance and its overtones, the plane configuration of said plate being such that all lateral modes coalesce to produce a single contour extensional mode, the planar dimensions of the plate being adapted to impart thereto a resonance of vibrations in said contour extensional mode at a particular selected frequency, and operating electrode means conductively associated with both major planar surfaces of said plate, including a first electrode on one of said major surfaces, a second electrode on said one major surface disposed about said first electrode and laterally spaced therefrom, and at least one additional electrode on the other of said major planar surfaces shaped, located and dimensioned to serve as a counter-electrode to those on said one major surface, said plate being polarized only in directions perpendicular to said major surfaces, the lateral extent of the polarization including at least the entire thickness regions of said plate underlying said first and second electrodes.

2. A piezoelectric resonator element comprising: a thin flat plate of polarizable ferroelectric ceramic material, said plate having substantially identical and parallel major planar surfaces having at least three-fold symmetry about an axis perpendicular thereto, the thickness dimension of said plate being sufficiently small relative to the planar dimensions thereof that, with the plate polarized perpendicular to said major surfaces, piezoelectric response of the plate to electric potential gradients between said major surfaces is predominently in the lateral modes and negligible in the thickness modes at frequencies near the fundamental resonance and its overtones, the plane configuration of said plate being such that all lateral modes coalesce to produce a single contour extensional mode, the planar dimensions of the plate being adapted to impart thereto a resonance of vibrations in said contour extensional mode at a particular selected frequency, and operating electrode means conductively associated with both major planar surfaces of said plate, including a first electrode substantially centered on one of said major surfaces, a second electrode on said one major surface, concentrically disposed about said first electrode, said second electrode being of substantially uniform width and laterally spaced from said first electrode by a substantially uniform distance, and at least one additional electrode on the other of said major planar surfaces shaped, located and dimensioned to serve as a counter-electrode to those on said one major surface, said plate being polarized only in directions perpendicular to said major surfaces, the lateral extent of the polarization including at least the entire thickness regions of said plate underlying said first and second electrodes.

3. A piezoelectric resonator element comprising: a thin flat plate of polarizable ferroelectric ceramic material, said plate having substantially identical and parallel major planar surfaces having at least three-fold symmetry about an axis perpendicular thereto, the thickness dimension of said plate being sufficiently small relative to the planar dimensions thereof that, with the plate polarized perpendicular to said major surfaces, piezoelectric response of the plate to electric potential gradients between said major surfaces is predominantly in the lateral modes and negligible in the thickness modes at frequencies near the fundamental resonance and its overtones, the plane configuration of said plate being such that all lateral modes coalesce to produce a single contour extensional mode, the planar dimensions of the plate being adapted to impart thereto a resonance of vibrations in said contour extensional mode at a particular selected frequency, and operating electrode means conductively associated with both major planar surfaces of said plate, including a first electrode substantially centered on and conforming to the shape of one of said major surfaces, a second electrode on said one major surface concentrically disposed about said first electrode, said second electrode being of substantially uniform width and laterally spaced from said first electrode by a substantially uniform distance, and an additional electrode on the other of said major planar surfaces covering an area substantially equal to and opposite that bounded by the outer edge of said second electrode, said plate being polarized only in a single direction perpendicular to said major surfaces, the lateral extent of the polarization including at least the entire thickness regions of said plate underlying said first and second electrodes.

4. A piezoelectric resonator element according to claim 3 wherein said plate is substantially a disk.

5. A piezoelectric resonator element according to claim 3 wherein said plate is a square with rounded corners.

6. A piezoelectric resonator element comprising: a thin flat disk of polarizable ferroelectric ceramic material, the thickness dimension of the disk being sufficiently small relative to its diameter that, with the disk polarized perpendicular to its major planar surfaces, its piezoelectric response, at frequencies near the fundamental resonance and its overtones, to electric potential gradients between said surfaces is effectively limited to the contour extensional mode, said diameter being such as to impart to the disk a particular resonance frequency of vibrations in said mode; and electrode means conductively associated with both said major planar surfaces for applying and deriving electric signal potentials to and from said disk, said electrode means including a first electrode substantially centered on one of said major planar surfaces, an annular electrode on said one major planar surface concentrically surrounding said first electrode, and at least one additional electrode on the other of said major surfaces dimensioned, shaped and located to serve as a counter-electrode to those on said one major surface, said disk being polarized, only in a direction perpendicular to said major surfaces, the lateral extent of the polarization including at least the entire thickness regions of the disk underlying the electrodes on said one major planar surface.

7. A piezoelectric resonator element comprising: a thin flat disk of polarizable ferroelectric ceramic material, the thickness dimension of the disk being sufficiently small relative to its diameter that with the disk polarized perpendicular to its major planar surfaces, its piezoelectric response, at frequencies near the fundamental resonance and its overtones, to electric potential gradients between said surfaces is effectively limited to the contour extensional mode, said diameter being such as to impart to the disk a particular resonant frequency of vibrations in said mode; and electrode means conductively associated with both said major planar surfaces for applying and deriving electric signal potentials to and from said disk, said electrode means including a substantially circular spot electrode concentrically disposed on one of said major planar surfaces, an annular electrode on said one major planar surface concentrically surrounding said spot electrode, and at least one additional electrode on the other of said major surfaces dimensioned, shaped and located to serve as a counter-electrode to those on said one major surface, said disk being polarized, only in a direction perpendicular to said major surfaces, the lateral extent of the polarization including at least the entire thickness regions of the disk underlying said spot and annular electrodes.

8. A piezoelectric resonator element comprising: a thin flat disk of polarizable ferroelectric ceramic material, the ratio of the diameter, of the disk to its thickness being at least 4:1, said diameter being such as to impart to the disk a particular resonance frequency of vibrations in the contour extensional mode; and electrode means conductively associated with both major planar surfaces of the disk for applying and deriving electric signal potentials to and from the disk, said electrode means including a substantially circular spot electrode concentrically disposed on one of said major planar surfaces, an annular electrode on said one major planar surface concentrically surrounding said spot electrode, and at least one additional electrode on the other of said major surfaces dimensioned, shaped and located to serve as a counter-electrode to those on said one major surface, said disk being polarized, only along axes perpendicular to said major surfaces, the lateral extent of the polarization including at least the entire thickness regions of the disk underlying the electrodes on said one major planar surface.

9. A piezoelectric resonator element comprising: a thin flat disk of polarizable ferroelectric ceramic material, the ratio of the diameter of the disk to its thickness being in the range 5:1 to 10:1, said diameter being such as to impart to the disk a particular fundamental resonance frequency of vibrations in the contour extensional mode; and electrode means conductively associated with both major planar surfaces of the disk for applying and deriving electric signal potentials to and from the disk, said electrode means including a substantially circular spot electrode, concentrically disposed on one of said major planar surfaces, an annular electrode on said one major planar surface concentrically surrounding said spot electrode, and at least one additional electrode on the other of said major surfaces dimensioned, shaped and located to serve as a counter-electrode to those on said one major surface, said disk being polarized, only along axes perpendicular to said major surfaces, the lateral extent of the polarization including at least the entire thickness regions of the disk underlying the electrodes on said one major planar surface.

10. A piezoelectric resonator element comprising: a thin flat disk of polarizable ferroelectric ceramic material, the ratio of the diameter of the disk to its thickness being in the range 5:1 to 10:1, said diameter being such as to impart to the disk a particular first overtone resonance frequency of vibrations in the contour extensional mode; and electrode means conductively associated with both the major planar surfaces of the disk for applying and deriving electric signal potentials to and from the disk, said electrode means including a substantially circular spot electrode, having a radius not substantially greater than 0.4 the radius of the disk, concentrically disposed on one of said major planar surfaces, an annular electrode, having an inner radius not substantially less than 0.4 the radius of the disk, on said one major planar surface concentrically surrounding and radially spaced from said spot electrode, and at least one additional electrode on the other of said major surfaces dimensioned, shaped and located to serve as a counter-electrode to those on said one major surface, said disk being polarized, only in a single direction perpendicular to said major surfaces, the lateral extent of the polarization including at least the entire thickness regions of the disk underlying the electrodes on said one major planar surface.

11. A piezoelectric resonator element comprising: a thin flat disk of polarizable ferroelectric ceramic material, the ratio of the diameter of the disk to its thickness being in the range 5:1 to 10:1, the diameter being such as to impart to the disk a resonance of mechanical vibrations in the contour extensional mode at a finite harmonic, having a particular selected frequency; and electrode means conductively associated with both major planar surfaces of said disk for applying and deriving electric signal potentials to and from said disk, said electrode means including a substantially circular spot electrode in substantially the center of one of said major surfaces of the disk, an annular electrode on said one major surface substantially concentric with said spot electrode and spaced radially outwardly therefrom, and at least one additional electrode on the other face of said disk covering an area at least substantially equal to and opposite that covered by said spot and annular electrode, said disk being polarized only along axes perpendicular to said major surfaces, the lateral extent of the polarization including at least the entire thickness regions of the disk underlying said spot and annular electrodes, the area of said circular electrode and the location and area of said annular electrode being such in relation to the distribution and phase of planar vibrational stresses in said disk as to minimize the cancellation of opposing fields and stresses between the output electrodes of said disk and the ratio of the effective areas of the input and output electrodes being selected to obtain the desired capacitance and impedance ratio between the input and output terminals of said disk, whereby a voltage transformation is obtained between said terminals.

References Cited in the file of this patent

UNITED STATES PATENTS

| | | |
|---|---|---|
| 2,262,966 | Rohde | Nov. 18, 1941 |
| 2,524,781 | Epstein | Oct. 10, 1950 |
| 2,830,274 | Rosen et al. | Apr. 8, 1958 |